United States Patent [19]

Shankar

[11] Patent Number: 5,204,556
[45] Date of Patent: Apr. 20, 1993

[54] PROGRAMMABLE INTERCONNECT STRUCTURE FOR LOGIC BLOCKS

[75] Inventor: Kapil Shankar, San Jose, Calif.

[73] Assignee: Lattice Semiconductor Corporation, San Jose, Calif.

[21] Appl. No.: 696,462

[22] Filed: May 6, 1991

[51] Int. Cl.[5] .......................... G06F 7/38; H03K 3/26
[52] U.S. Cl. ............................. 307/465.1; 307/465; 307/482.1; 307/303.1
[58] Field of Search .................. 307/465, 465.1, 482.1, 307/303, 303.1

[56] References Cited

U.S. PATENT DOCUMENTS

| | | | |
|---|---|---|---|
| 4,717,844 | 1/1989 | Shima et al. | 307/465 |
| 4,758,746 | 7/1989 | Birkner et al. | 307/465 |
| 4,910,508 | 3/1990 | Yamazaki | 307/465 |
| 4,965,472 | 10/1990 | Anderson | 307/465 |
| 4,992,680 | 2/1991 | Benedetti et al. | 307/465.1 |
| 5,015,884 | 5/1991 | Agrawal et al. | 307/465 |

Primary Examiner—David R. Hudspeth
Assistant Examiner—Richard Roseen
Attorney, Agent, or Firm—Skjerven, Morrill, MacPherson, Franklin & Friel

[57] ABSTRACT

A structure for making programmable connections between the input and output terminals of individual logic blocks in a logic device is disclosed. In one embodiment, each output terminal is programmably connected to only one input terminal of each logic block. The same principle is followed in making connections between the input pins of the device and the input terminals of the logic blocks.

19 Claims, 10 Drawing Sheets

✳ = PROGRAMMABLE CONNECTION
+ = NO PROGRAMMABLE CONNECTION

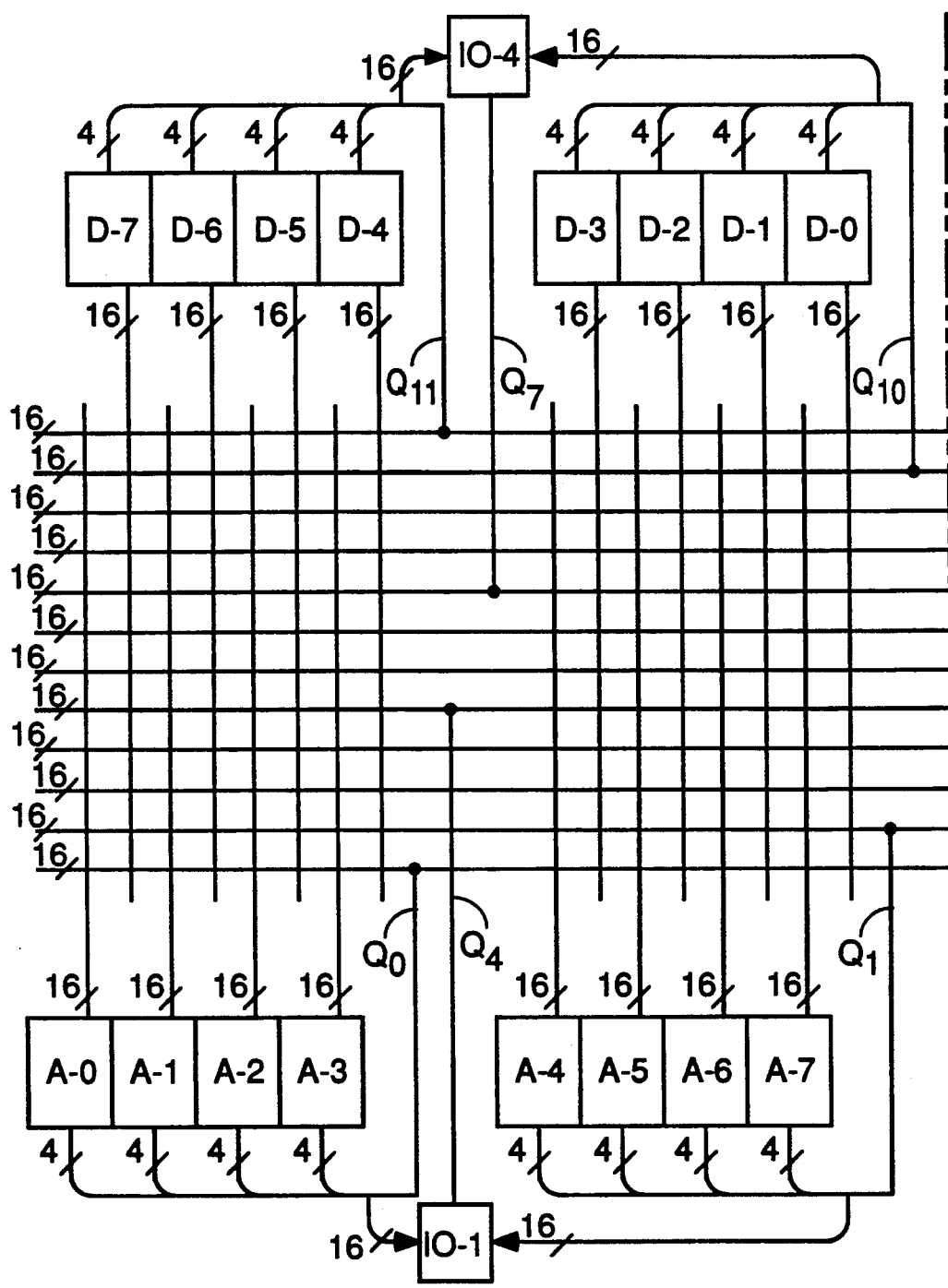
FIG. 4A
KEY TO FIG. 4
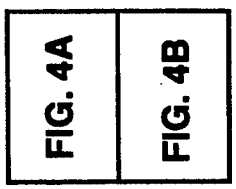

BIPOLAR FUSE

BIPOLAR FUSE

CMOS PASS GATE

PROGRAMMABLE INTERCONNECT STRUCTURE FOR LOGIC BLOCKS

FIELD OF THE INVENTION

This invention relates to programmable interconnect structures which link the respective inputs and outputs of a plurality of logic blocks, such as in field programmable gate arrays and high density programmable logic arrays, and which link the inputs and outputs of a logic device to each other and to the inputs and outputs of the logic blocks.

BACKGROUND OF THE INVENTION

Logic devices such as field programmable gate arrays (FPGA's) and high density programmable logic devices (HDPLD's) normally consist of a plurality of "logic blocks", each having a number of inputs and a number of outputs. Internally, the typical structure of the logic block consists of a programmable AND array whose outputs feed an OR array. FIG. 1 shows a simplified prior art logic block in the form of a programmable logic device (PLD) wherein inputs $I_0$ and $I_1$ feed through a programmable array 10 to four AND gates 11. The outputs of AND gates 11 feed through an array 12 to OR gates 13, and thence to outputs $O_0$ and $O_1$. The logic block shown in FIG. 1 is in the familiar sum of the products form, the outputs of AND gates 11 often referred to as the "product terms". In the representative structure shown in FIG. 1 either one of inputs $I_0$ and $I_1$ may be connected by means of the array 10 to the inputs of any one or more of AND gates 11.

In a logic device consisting of a number of individual logic blocks, any output of a logic block may need to be connected to an input of the same logic block or an input of one of the other logic blocks. This is accomplished in an area of the chip known as the interconnect area. Also, the external device inputs can routed to the logic block inputs using the interconnect area, and similarly the logic block outputs can be routed to external pins and input/output cells as outputs using the same interconnect area. The interconnect area normally comprises a matrix or latticework of intersecting input and output lines, with each output of a logic block intersecting all inputs of the same logic block and all other logic blocks once. Thus, in a device with X inputs and Y outputs, the number of such intersections equals XY.

The prior art solution to the interconnect problem is to place a programmable connection at each of the intersections, thereby allowing every output to be connected to any input of the entire device. Since each of the programmable connections takes up space, this type of arrangement increases the total size of the interconnect area and of the device itself. This increases the cost of the device. Moreover, the number of programmable connections on a given input or output line increases the loading on the line and reduces the speed of the device.

SUMMARY OF THE INVENTION

In one embodiment of an interconnect structure in accordance with this invention, each of a plurality of logic blocks in a logic device has an equal number of inputs and outputs. At each intersection between a group of outputs of a logic block and a group of inputs of a logic block, each individual output line is programmably interconnected with only one of the input lines, forming a diagonal pattern of programmable interconnects. This assures that each output line can be connected to any given logic block through one input to that logic block. A programmable array internal to the block is then used to route the signal as desired within that block. By this technique the number of programmable interconnects required in the interconnect area may be reduced from $N^2$ (N being the total number of inputs, which equals the total number of outputs) to a minimum of N. This dramatically reduces the size and cost of the device and improves the speed at which the signals are transmitted from the outputs to the various inputs of the logic blocks. In accordance with this invention, it is not required that the number of programmable connections be reduced to the minimum of N. Any number between N and $N^2$ may also be selected within in broad principles of this invention.

In the embodiment just described, each logic block has an equal number of inputs and outputs. In many situations this is not an optimal structure, since most logic blocks have fewer outputs than inputs. To overcome this problem, in a second embodiment of the invention, the logic blocks are grouped into what are called "megacells", the logic blocks in each megacell having a combined number of outputs equal to the number of inputs to each block within the megacell. This means that each intersection between the outputs of a megacell and the inputs to a particular logic block will have an equal number of lines crossing each other, and the diagonal pattern of programmable interconnects described above can be implemented, thereby assuring that each output may be connected to one input of every logic block. Use of the programmable interconnect structure of this invention requires that the inputs to the logic block be to some extent interchangeable in the sense that a signal on one input can be programmably transferred within the block. Preferably, there is complete interchangeability, as in the logic block of FIG. 1 where either of inputs $I_0$ and $I_1$, can be routed to any or all of AND gates 11. However, this invention is also applicable to logic blocks (e.g., combinations of multiplexers) which have less than complete interchangeability.

The interconnect structure of this invention requires that the interconnections be planned so as to assure complete connectivity, i.e., that the reduced number of programmable connections are used as efficiently as possible so that every required connection between an output and an input can in fact be made.

DESCRIPTION OF THE DRAWINGS

FIGS. 4A and 4B are a two part overview of an interconnect structure for a high density programmable logic device consisting of 32 logic blocks.

DESCRIPTION OF THE INVENTION

Figure 2:
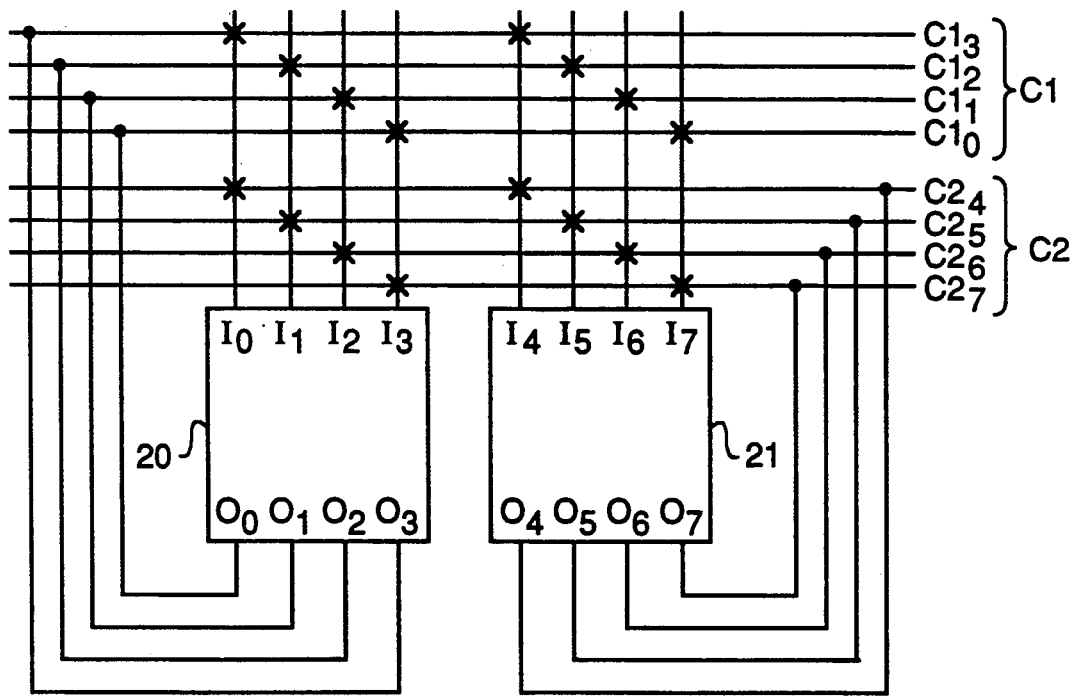
FIG. 2 illustrates an interconnect structure in accordance with the invention for logic blocks having an equal number of inputs and outputs.

FIG. 2 shows a logic block 20 and a logic block 21, each of which has four inputs and four outputs. The inputs and outputs of logic block 20 are designated $I_0$–$I_3$ and $O_0$–$O_3$, respectively. The inputs and outputs of logic block 21 are designated $I_4$–$I_7$ and $O_4$–$O_7$, respectively. The outputs $O_0$–$O_3$ of logic block 20 are connected respectively to interconnect lines $C1_0$–$C1_3$ of a routing channel C1. The outputs $O_4$–$O_7$ of logic block 21 are connected respectively to interconnect lines $C2_4$–$C2_7$ of a routing channel C2. The connections between the outputs of logic block 20 and routing channel C1 and between the outputs of logic block 21 and routing channel C2 are hard-wired and are not programmable.

Routing channels C1 and C2 intersect the inputs to logic blocks 20 and 21 in a 4×4 matrix. As described above, the prior art solution to providing interconnect capability between the outputs and the inputs of logic blocks 20 and 21 would be to provide a programmable connection at each point of the 4×4 matrix, requiring 16 programmable connections. However, in accordance with the invention, each of the outputs of logic blocks 20 and 21 is provided with a programmable connection with only one of the inputs to logic blocks 20 and 21. The programmable connections are designated by "X's" in FIG. 2. For example, output $O_0$ may be connected to an input of logic block 20 via input $I_3$ and to the inputs of logic block 21 via input $I_7$. Similarly, output $O_5$ of logic block 21 may be connected to the inputs of logic block 21 via input $I_5$ and to the inputs of logic block 20 via input $I_1$.

Figure 1:
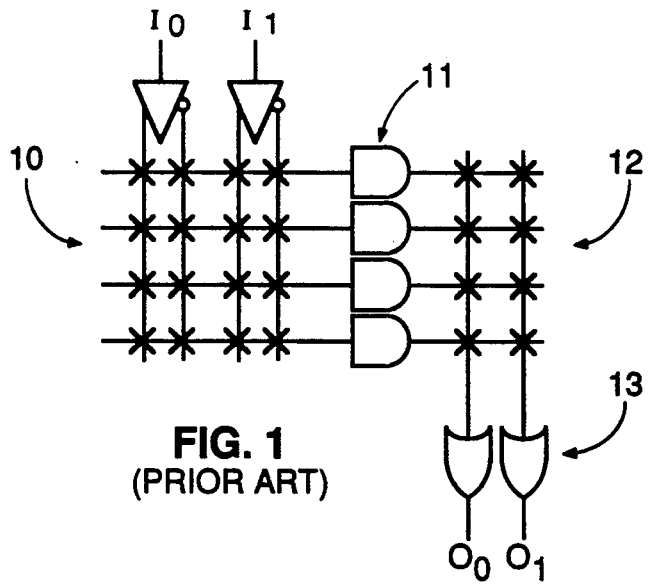
FIG. 1 illustrates the structure of a typical logic block.

As described above (see FIG. 1), the AND array within a typical field programmable gate array or programmable logic device allows the designer to connect the inputs to the AND gates within the device in any desired manner. For example, if outputs $O_0$ and $O_5$ are to be ANDed in logic block 21, a connection can be programmed between output $O_0$ ($C1_0$) and the line to input $I_7$, and a connection can be programmed between output $O_5$ ($C2_5$) and the line to input $I_5$. Inputs $I_5$ and $I_7$ can then be connected to respective inputs of an AND gate within logic block 21.

The technique of this invention accordingly allows the total number of programmable inputs in the structure shown in FIG. 2 to be reduced from a total of 64 to a minimum of 16.

Figure 3:
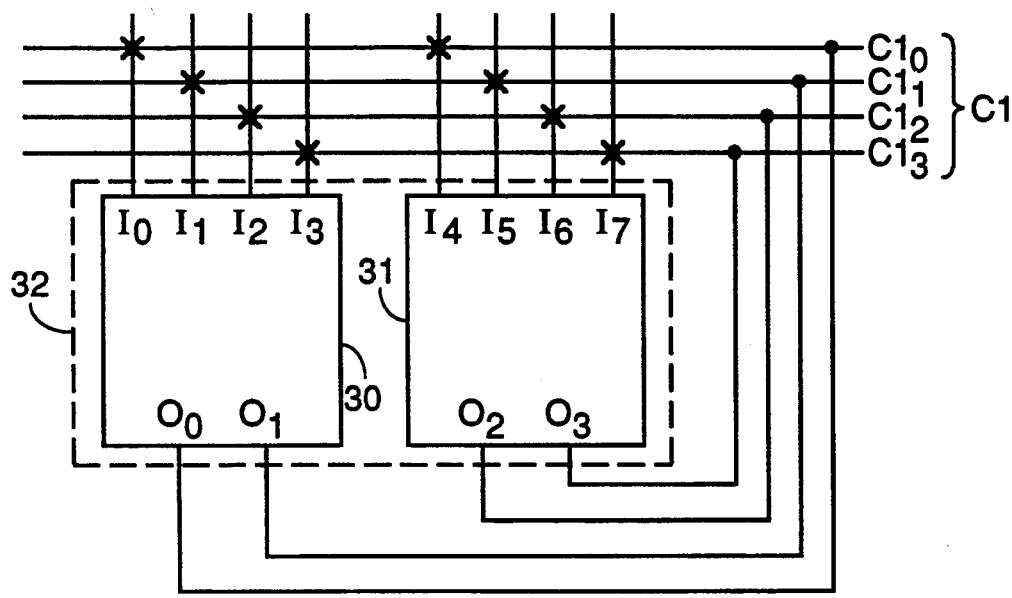
FIG. 3 illustrates an interconnect structure with the logic blocks grouped into megacells, the number of outputs from a megacell equaling the number of inputs to each logic block within the megacell.

Relatively few logic blocks have an equal number of inputs and outputs like logic blocks 20 and 21. Generally, there are fewer outputs than inputs. To apply the principles of this invention to logic blocks having unequal numbers of inputs and outputs, a structure such as that shown in FIG. 3 is used. In FIG. 3, logic blocks 30 and 31 each have four inputs and two outputs. Logic blocks 30 and 31 are grouped in a megacell 32 which has outputs $O_0$–$O_3$. These outputs are connected to lines $C1_0$–$C1_3$, respectively, of a routing channel C1. Respective sets of four programmable connections (designated by X's) connect lines $C1_0$–$C1_3$ to inputs $I_0$–$I_3$ and inputs $I_4$–$I_7$.

An examination of FIG. 3 will indicate that each of outputs $O_0$–$O_3$ may be linked via the programmable connections with one input of each of logic blocks 30 and 31. For example, output $O_1$ has access to logic block 31 via the programmable connection between line $C1_1$ and the line to input $I_5$. Similarly, output $O_3$ has access to logic block 30 via the programmable connection between line $C1_3$ and the line to input $I_3$. Since inputs $I_0$–$I_3$ of logic block 30 can be ANDed in any desired combination at the AND gates within logic block 30, outputs $O_0$–$O_3$ can be ANDed in the same ways via the programmable connections between lines $C1_0$–$C1_3$ and the lines to inputs $I_0$–$I_3$, respectively. Outputs $O_0$–$O_3$ can likewise be ANDed in logic block 31 by means of the programmable connections between lines $C1_0$–$C1_3$ and the lines to inputs $I_4$–$I_7$, respectively.

Figure 4B:
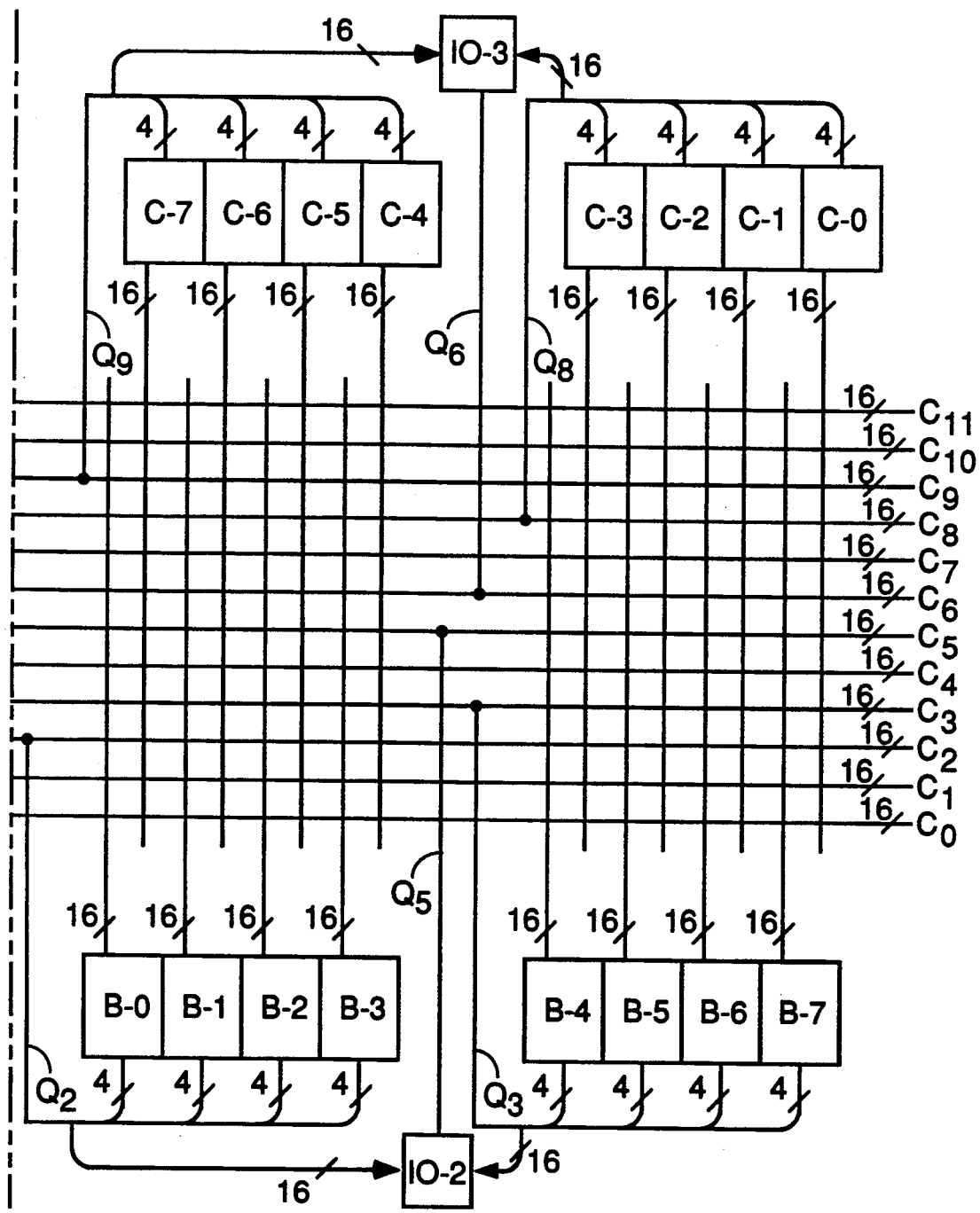

FIG. 4 shows an HDPLD containing 32 logic blocks designated A-0 to A-7, B-0 to B-7, C-0 to C-7, and D-0 to D-7. Each of these logic blocks has 16 inputs (an "input channel") and 4 outputs. To preserve the clarity of the drawing, individual input and output lines are not shown. Instead, a single line represents all of the inputs to a logic block, and another single line represents all of the outputs from a logic block. Logic blocks A-0 to D-7 have been grouped into 8 megacells, as follows: A-0 to A-3, A-4 to A-7, B-0 to B-3, B-4 to B-7, C-0 to C-3, C-4 to C-7, D-0 to D-3, and D-4 to D-7. The 16 outputs of each megacell are shown as output channels $Q_0$–$Q_3$ and $Q_8$–$Q_{11}$, each of which contains 16 output lines. Routing channels $C_0$–$C_{11}$, each containing 16 interconnect lines, are also shown. Signals flow to and from the HDPLD through input/output (I/O) blocks IO-1, IO-2, IO-3 and IO-4, each of which contains 16 I/O pins.

Input channels $Q_4$–$Q_7$ from I/O blocks IO-1 to IO-4 (each input channel containing 16 input lines) are hard-wired to routing channels $C_4$–$C_7$, respectively, one line of input channels $Q_4$–$Q_7$ being hard-wired to one line of routing channels $C_4$–$C_7$, respectively. The connections between output channels $Q_0$–$Q_3$ and $Q_8$–$Q_{11}$ and routing channels $C_0$–$C_3$ and $C_8$–$C_{11}$ are hard wired so that one line of each output channel is connected to one line of the corresponding routing channel. Thus each of routing channels $C_0$–$C_{11}$ is an extension of a corresponding one of output channels $Q_0$–$Q_3$ and $Q_8$–$Q_{11}$ or of I/O blocks IO-1 to IO-4.

Figure 5A:
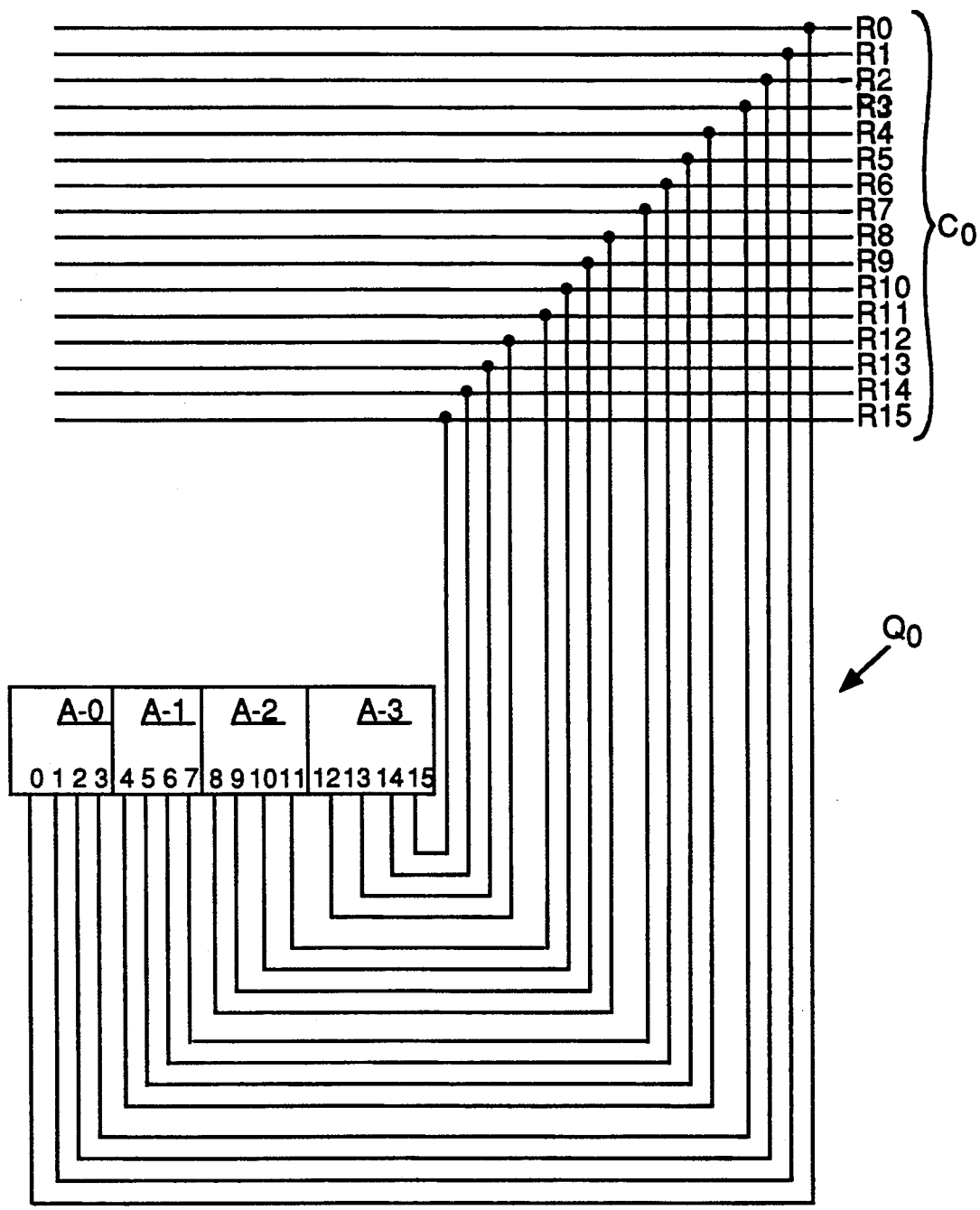
FIGS. 5A, 5B, and 5C illustrate the placement of interconnects at the intersection between a routing channel and, respectively, the outputs of a megacell, the input lines from the input/output cells, and the input lines to the logic blocks, in the embodiment of FIG. 4.

FIG. 5A shows in detail the hard-wire connections between the outputs of the megacell consisting of logic blocks A-0 to A-3 and the interconnect lines in routing channel $C_0$. As shown, output 0 of logic block A-0 is connected to interconnect line R0, output 1 of logic block A-0 is connected to interconnect line R1, etc. A similar pattern is followed in making the connection between the outputs of the megacells consisting of logic blocks A-4 to A-7, B-0 to B-3, B-4 to B-7, C-0 to C-3, C-4 to C-7, D-0 to D-3, and D-4 to D-7 with routing channels $C_1$ to $C_3$ and $C_8$ to $C_{11}$, respectively.

Figure 5B:
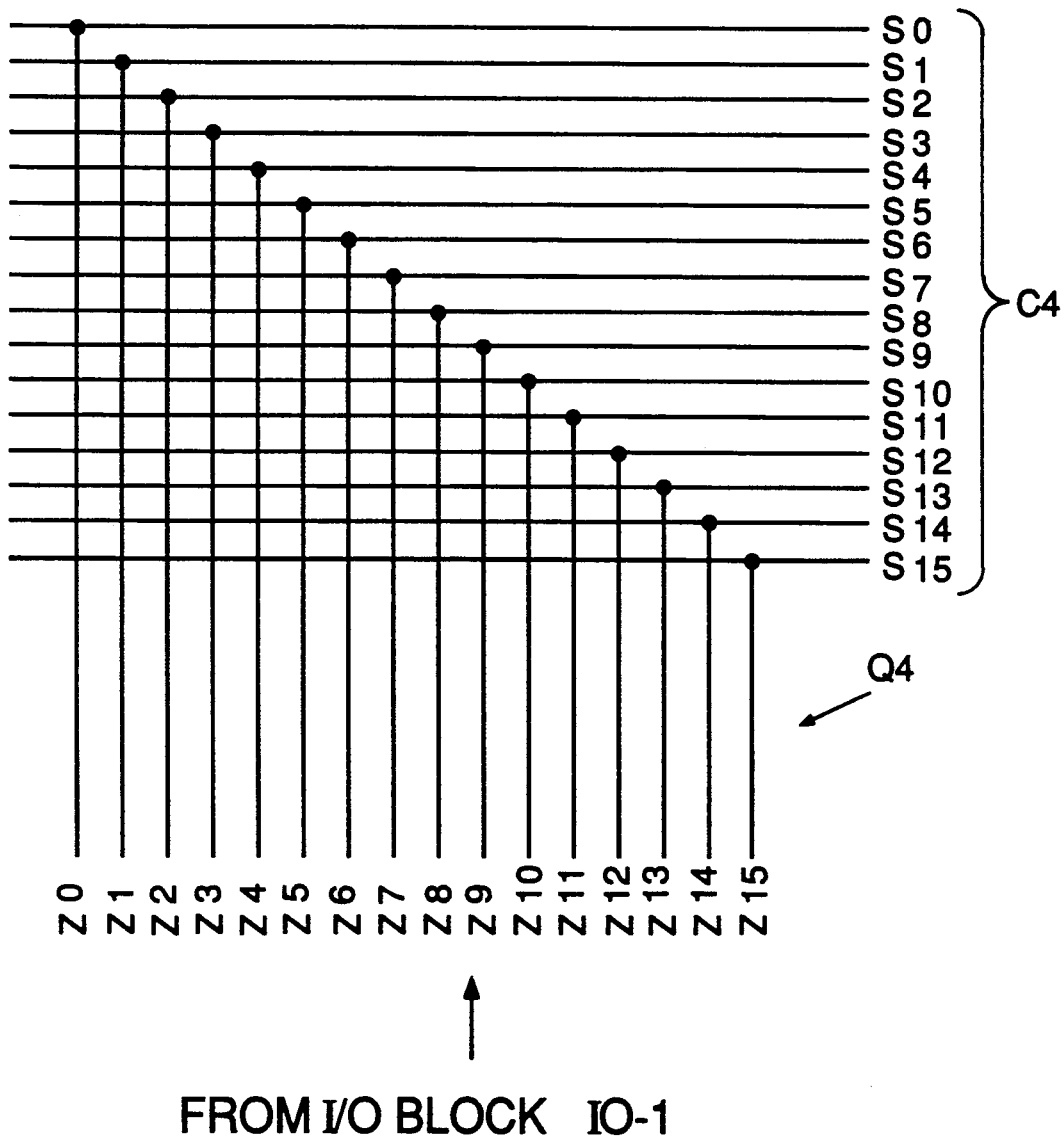

FIG. 5B shows in detail the hard-wire connections between the lines of input channel $Q_4$ and the interconnect lines in routing channel $C_4$. Line Z0 of channel $Q_4$ is connected to interconnect line S0, line Z1 of channel $Q_4$ is connected to interconnect line S1, etc. A similar pattern is followed in making, the hard-wire connections between input/output blocks IO-2, IO-3 and IO-4 and routing channels $C_5$, $C_6$ and $C_7$, respectively.

Figure 5C:
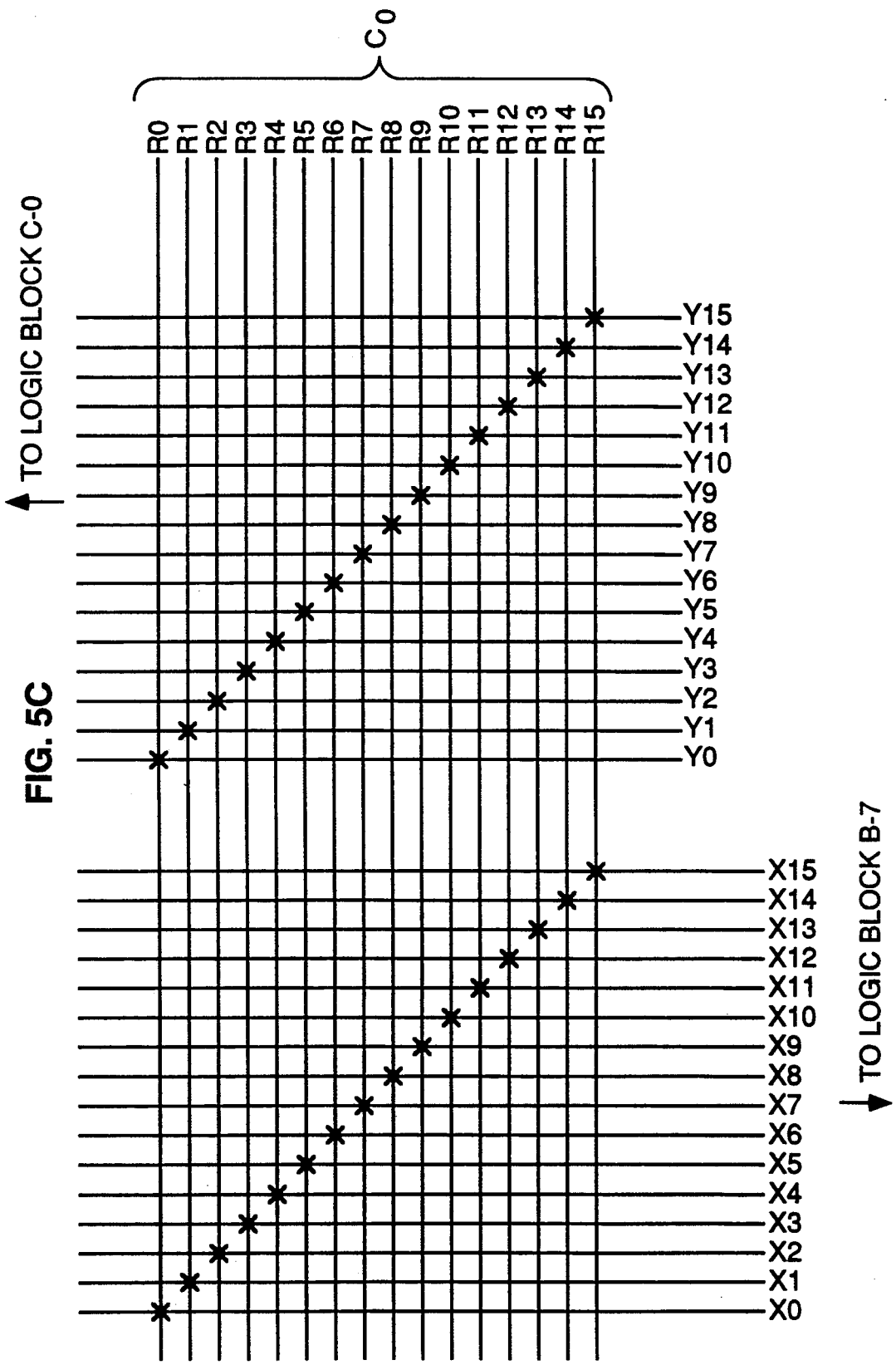

FIG. 5C shows in detail the programmable connections between routing channel $C_0$ and the input channels to logic blocks B-7 and C-0. The input channel to logic block B-7 includes input lines X0 to X15. The input channel to logic block C-0 includes input lines Y0 to Y15. Routing channel $C_0$ includes interconnect lines R0 to R15. Each of interconnect lines R0–R15 is connected to one of lines X0–X15 and one of lines Y0–Y15. Thus line R0 is connected to lines X0 and Y0, line R1 is connected to lines X1 and Y1, etc.

This pattern is repeated throughout the array. In general, a line in a particular position in an input channel is connected to lines in the equivalent position of routing channels $C_0$–$C_{11}$. For example, line Y0 is connected to the line in the "0" position of routing channels $C_0$–$C_{11}$. Line Y1 is connected to the corresponding line in the "1" position of each of these routing channels. This enables any given output to be connected to one input of each of logic blocks A-0 to D-7. For example, referring to FIGS. 5A and 5C, output 10 of logic block A-2, which is connected to interconnect line R10, would have access to logic block B-7 through input line X10 and to logic block C-0 through input line Y10. As described previously, once a signal on input lines X10 or Y10 reaches logic blocks B-7 or C-0, respectively, it can be ANDed with any of the other inputs to those logic blocks by means of internal programmable connections. Similarly, referring to FIG. 5B, line Z10 of input channel $Q_4$, which is connected to interconnect line S10, would have access to logic block B-7 through input line X10 and logic block C-0 through input line Y10.

Accordingly, the programmable interconnect structure of this invention permits the total number of programmable connections at each intersection of one of routing channels $C_0$ to $C_{11}$ with the input channels to one of logic blocks A-0 to D-7 to be reduced from a total of 256 to a minimum of 16. In accordance with this invention, it is not necessary that the number of programmable connections be reduced to the minimum number of 16. Any number between 16 and 256 could also be selected, depending on the routing demands of the particular application. In practice, the selection of the number of programmable connections to be used will often require a balancing of the space limitations imposed on the interconnect structure against the need to provide maximum routability.

A constraint of the interconnect structure shown in FIG. 4 is that once a particular line of a routing channel has been used to gain access to a logic block, no interconnect line in the same position of any other routing channel may be used for inputting signals to the same logic block. No two signals that are input to a particular logic block may be located on interconnect lines in the same position. In the example given above, if interconnect line R10 of routing channel $C_0$ is used to connect output 10 of logic block A-3 to an input of logic block B-7, no interconnect line in the "10" position of routing channels $C_1$–$C_{11}$ may be used to transmit a signal to logic block B-7.

The transfer function to be performed by the HDPLD shown in FIG. 4 is partitioned by known techniques into the individual logic blocks. The resulting logic blocks are then placed in the available positions on the device, and the outputs of each logic block are arranged so as to assure that all required connections between the inputs and outputs of the logic blocks and the I/O cells can be made.

I/O blocks IO-1 to IO-4 each contain 16 I/O cells of the kind disclosed in U.S. application Ser. No. 07/696,907, filed May 6, 1991, which is incorporated herein by reference, as well as an output routing resource arrangement of the kind illustrated in FIG. 6, described below, wherein 32 logic block outputs are programmably connected through a programmable matrix to 16 I/O cells. As described in the above-noted U.S. application Ser. No. 07/696,907 (see FIG. 6 thereof), each I/O cell contains an I/O pin.

In the routing process, as the logic blocks are placed and their outputs are assigned a sequence, a conflict may occur between the configuration required for routing purposes and the external pin assignments of the device. For example, a given output may be assigned to a particular position where it is connected to a pin which is required for an input or for a different output. If the external requirements of pin assignment are satisfied, the routability of the device may become more difficult.

Figure 6:
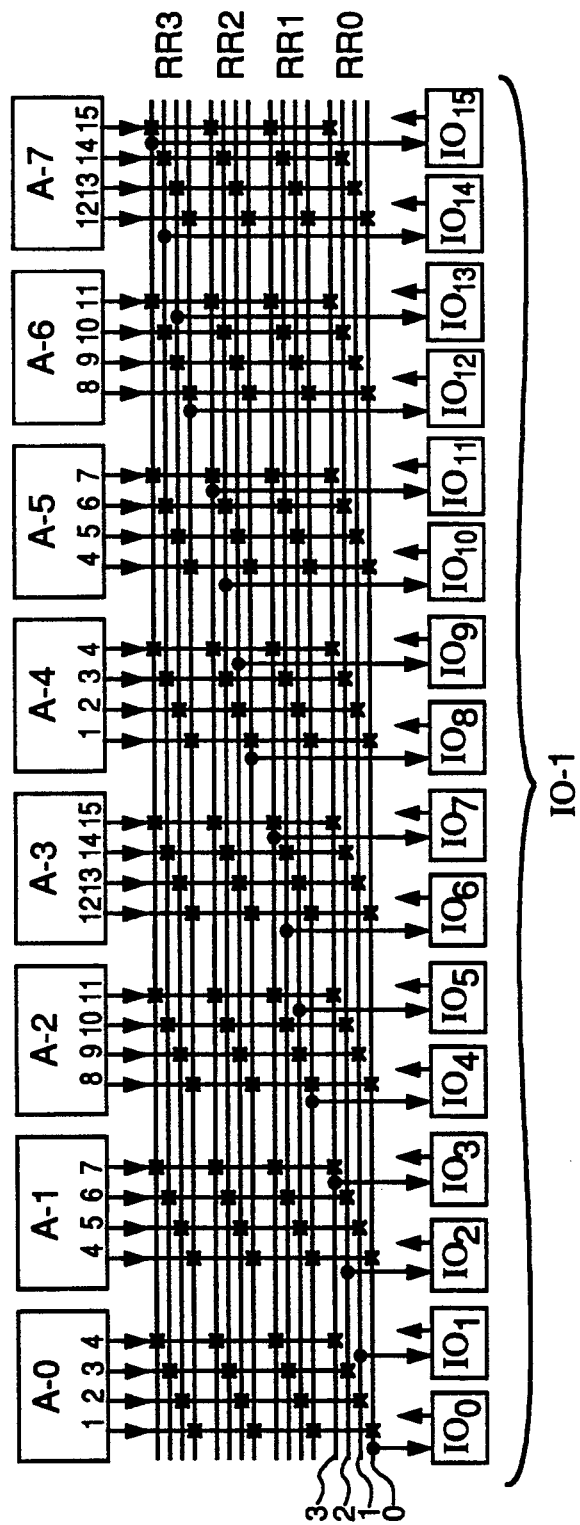
FIG. 6 illustrates an output routing resource arrangement in accordance with another aspect of the invention.

This problem is minimized by the output routing resource arrangement which is shown in FIG. 6. FIG. 6 shown logic blocks A-0 to A-7 and the 16 I/O cells $IO_0$–$IO_{15}$ associated with I/O cell IO-1. Each of routing resource channels RR0, RR1, RR2 and RR3 contains four lines 0, 1, 2 and 3. Each of cells $IO_0$–$IO_{15}$ is hard-wired to one of the lines in channels RR0 to RR3. For example, cell $IO_0$ is connected to line 0 of channel RR0; cell $IO_1$ is connected to line 1 of channel RR0; etc. Each output of logic blocks A-0 to A-7 is programmably connected to a line in a given position of each of channels RR0 to RR3. For example, output 0 of logic block A-0 is programmably connected to line 0 of each of channels RR0 to RR3; output 1 of logic block A-0 is programmably connected to line 1 of each of channels RR0 to RR3; etc. This structure permits any output of logic blocks A-0 to A-7 to be shifted among four of cells $I_0$–$I_{15}$. For example, output 0 of logic block A-0 may be routed to cells $IO_0$, $IO_4$, $IO_8$ or $IO_{12}$. If cell $IO_0$ is needed for a particular external purpose, the arrangement of logic blocks A-0 to A-7 need not be affected. The remaining cells $IO_1$–$IO_{15}$ may be used to handle the outputs of logic blocks A-0 to A-7.

Figure 7:
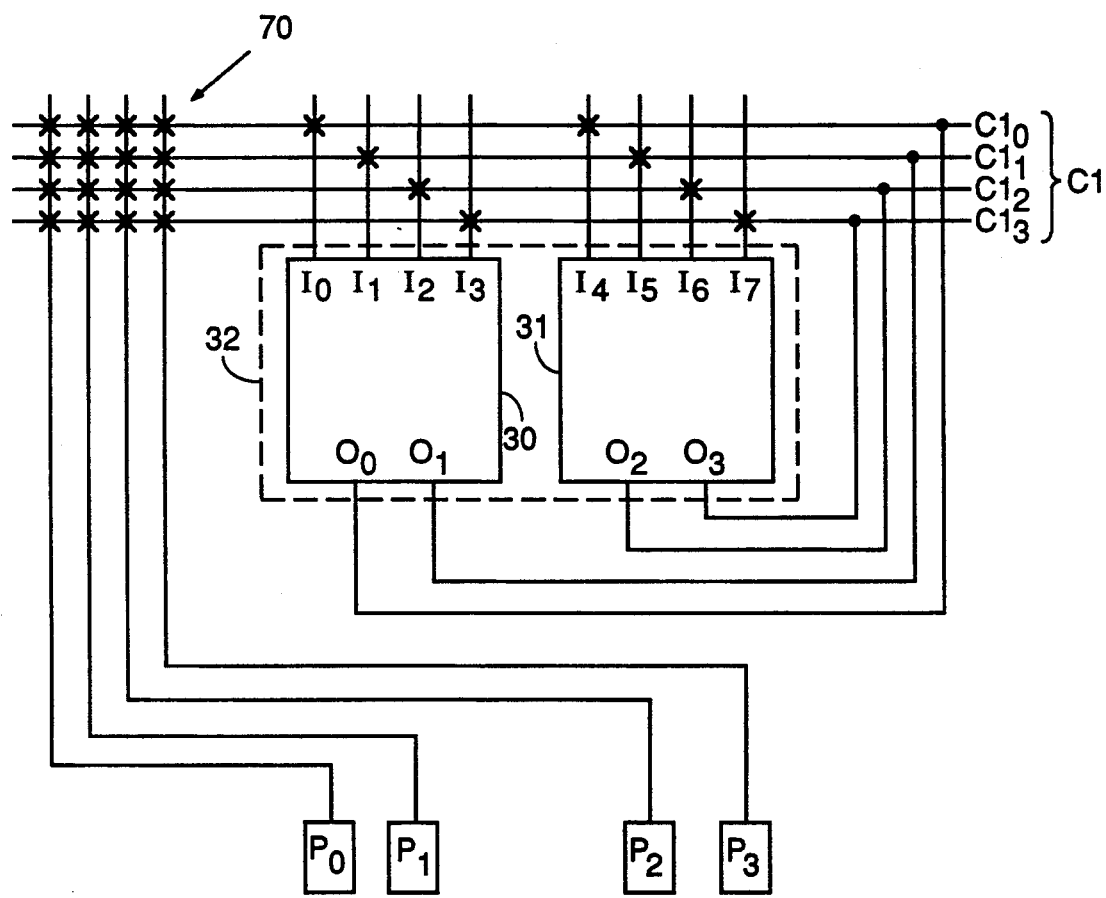
FIG. 7 illustrates another embodiment of an output routing resource arrangement.

As illustrated in FIG. 7, a similar flexibility in assigning pins can be provided by providing programmable connections between the I/O pins and the routing channels which are used to link the inputs of the logic blocks with the I/O cells and the outputs of the logic blocks, as described above. FIG. 7 is an expansion of FIG. 3, showing in addition I/O pins $P_0$, $P_1$, $P_2$, and $P_3$ which are programmably connected to interconnect lines $C1_0$–$C1_3$ of routing channel C1, in an interconnect matrix 70. By making the appropriate connections in matrix 70 each of outputs $O_0$–$O_3$ may be connected to any of pins $P_0$–$P_3$.

The programmable interconnect structure of this invention can be used with any type of logic block having a plurality of inputs and a plurality of outputs, including but not limited to programmable logic devices (PLD's), such as programmable array logic/generic array logic circuits (PAL/GAL's) and programmable logic arrays (PLA's), random access memories (RAM's), programmable read only memories (PROM's), erasable programmable read only memories (EPROM's), electrically erasable programmable read only memories (EEPROM's) and combinations of multiplexers.

Figure 8A:
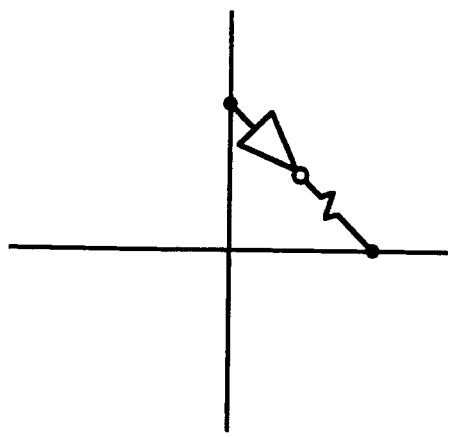
FIGS. 8A–8E illustrate alternative types of programmable connections which may be used in embodiments of the invention.
Figure 8B:
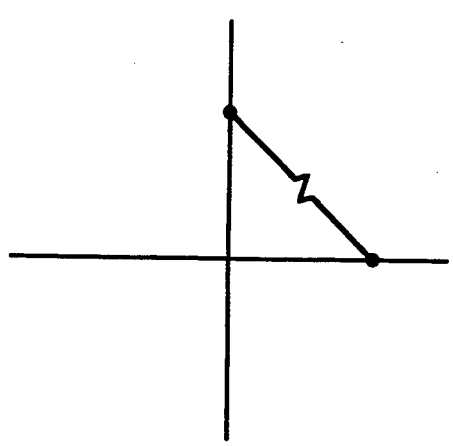
Figure 8C:
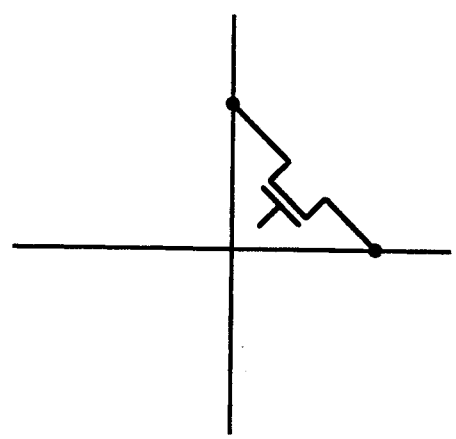
Figure 8D:
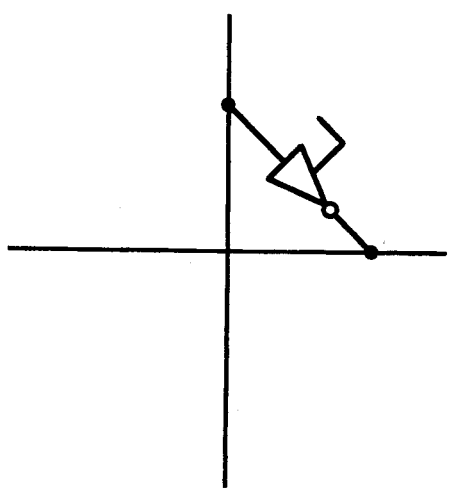
Figure 8E:
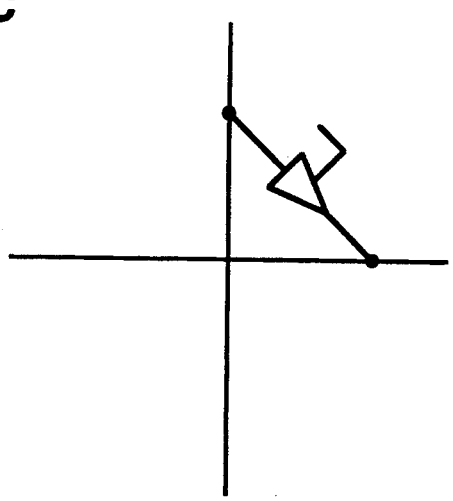

Moreover, the programmable connections used in embodiments of this invention may be made by any means or technique of programming a connection between electrical conductions paths, including but not limited to bipolar fuses (FIGS. 8A and 8B), antifuses, and CMOS pass gates (FIG. 8C) or antifuses tristate buffers with enable/disable fuses (FIGS. 8D and 8E) controlled by SRAM's, EPROM's, EEPROM's or other memory cells. The programmable connection described in U.S. application Ser. No. 07/696,543, co-owned and filed concurrently herewith, which is hereby incorporated herein by reference, may also be used.

While certain embodiments of this invention have been described, other embodiments of this invention will be obvious to those skilled in the art as a result of this description.

We claim:

1. A programmable interconnect structure comprising:
    a plurality of logic blocks, each of said logic blocks having a plurality of input terminals and a plurality of output terminals, the number of output terminals of each logic block being less than the number of input terminals of said logic block;
    an input channel to each of said one or more logic blocks, each input channel comprising a plurality of input lines connected to predetermined input terminals of a predetermined one of said logic blocks;
    a plurality of signal routing channels, each of said signal routing channels comprising a plurality of signal routing lines;
    said logic blocks being grouped into one or more megacells, each of said megacells containing more than one logic block, the output terminals of the logic blocks in each of said megacells being connected to predetermined signal routing lines in a predetermined one of said signal routing channels; and
    a matrix of programmable connections between each of said input channels and each of said signal routing channels wherein the number of said programmable connections in each said matrix is less than the number of input lines in said matrix multiplied by the number of signal routing lines in said matrix and equal to or greater than the number of input lines in said matrix.

2. The programmable interconnect structure of claim 1 wherein the number of output terminals of the logic blocks in each of said megacells is equal to the number of input terminals of each of said logic blocks.

3. The programmable interconnect structure of claim 1 wherein each of said signal routing lines is programmably connected to only one of said input lines in each of said input channels.

4. The programmable interconnect structure of claim 1 comprising a plurality of device terminals, said device terminals being separated into groups, the device terminals in each of said groups being connected through input/output cells to predetermined signal routing lines in a predetermined one of said signal routing channels.

5. The programmable interconnect structure of claim 1 comprising a plurality of resource routing lines and a plurality of device terminals, predetermined ones of said output terminals being programmably connectable to predetermined ones of said resource routing lines, predetermined ones of said resource routing lines being connected through input/output cells to predetermined ones of said device terminals.

6. The programmable interconnect structure of claim 1 comprising:
    a plurality of device terminals, said device terminals being separated into groups, the device terminals in each of said groups being connected through input/output cells to predetermined signal routing lines in a predetermined one of said signal routing channels; and
    a plurality of resource routing lines, predetermined ones of said output terminals being programmably connectable to predetermined ones of said resource routing lines, predetermined ones of said resource routing lines being connected through input/output cells to predetermined ones of said device terminals.

7. A programmable logic device comprising a plurality of logic blocks, each of said logic blocks having a plurality of input terminals connected to respective input lines and a plurality of output terminals connected to respective output lines, and a plurality of device terminals, wherein each of said output lines is programmably connectable to at least one but less than all of the input lines for each of said logic blocks, and predetermined ones of said output terminals are programmably connectable through input/output cells to predetermined ones of said device terminals.

8. A programmable logic device comprising a plurality of logic blocks, each of said logic blocks having a plurality of input terminals connected to respective input lines and a plurality of output terminals connected to respective output lines, and
    a plurality of device terminals,
    wherein each of said device terminals is programmably connectable to at least one but less than all of the input lines for each of said logic blocks, and predetermined ones of said output terminals are programmably connectable through input/output cells to predetermined ones of said device terminals.

9. A programmable logic device comprising:
    a plurality of programmable logic blocks, each of said logic blocks comprising a plurality of input terminals and a plurality of output terminals;
    a plurality of device terminals;
    an output routing resource arrangement, said output routing resource arrangement comprising a plurality of programmable connections for connecting individual ones of said output terminals through input/output cells to individual ones of said device terminals, said programmable connections being located outside of said logic blocks;
    wherein at least one of said device terminals is programmably connectable via said output routing resource arrangement to output terminals in two or more of said logic blocks; and
    wherein at least one of said logic blocks is in the sum of the products form.

10. A programmable logic device comprising:
    a plurality of programmable logic blocks, each of said logic blocks comprising a plurality of input terminals and a plurality of output terminals;
    a plurality of device terminals;
    an output routing resource arrangement, said output routing resource arrangement comprising a plurality of programmable connections for connecting individual ones of said output terminals though input/output cells to individual ones of said device terminals, said programmable connections being located outside of said logic blocks;

wherein at least one of said device terminals is programmably connectable via said output routing resource arrangement to output terminals in two or more of said logic blocks; and wherein at least one of said logic blocks comprises a programmable logic device (PLD).

11. A programmable logic device comprising:

a plurality of programmable logic blocks, each of said logic blocks comprising a plurality of input terminals and a plurality of output terminals;

a plurality of device terminals;

an output routing resource arrangement, said output routing resource arrangement comprising a plurality of programmable connections for connecting individual ones of said output terminals through input/output cells to individual ones of said device terminals, said programmable connections being located outside of said logic blocks;

wherein at least one of said device terminals is programmably connectable via said output routing resource arrangement to output terminals in two or more of said logic blocks; and wherein at least one of said logic blocks comprises a programmable array logic/generic array logic circuit (PAL/GAL).

12. A programmable logic device comprising:

a plurality of programmable logic blocks, each of said logic blocks comprising a plurality of input terminals and a plurality of output terminals;

a plurality of device terminals;

an output routing resource arrangement, said output routing resource arrangement comprising a plurality of programmable connections for connecting individual ones of said output terminals through input/output cells to individual ones of said device terminals, said programmable connections being located outside of said logic blocks;

wherein at least one of said device terminals is programmably connectable via said output routing resource arrangement to output terminals in two or more of said logic blocks; and wherein at least one of said logic blocks comprises a programmable logic array (PLA).

13. A programmable logic device comprising:

a plurality of programmable logic blocks, each of said logic blocks comprising a plurality of input terminals and a plurality of output terminals;

a plurality of device terminals;

an output routing resource arrangement, said output routing resource arrangement comprising a plurality of programmable connections for connecting individual ones of said output terminals through input/output cells to individual ones of said device terminals, said programmable connections being located outside of said logic blocks;

wherein at least one of said device terminals is programmably connectable via said input routing resource arrangement to output terminals in two or more of said logic blocks; and wherein at least one of said logic blocks comprises a random access memory (RAM).

14. A programmable logic device comprising:

a plurality of programmable logic blocks, each of said logic blocks comprising a plurality of input terminals and a plurality of output terminals;

a plurality of device terminals;

an output routing resource arrangement, said output routing resource arrangement comprising a plurality of programmable connections for connecting individual ones of said output terminals through input/output cells to individual ones of said device terminals, said programmable connections being located outside of said logic blocks;

wherein at least one of said device terminals is programmably connectable via said output routing resource arrangement to output terminals in two or more of said logic blocks; and wherein at least one of said logic blocks comprises a programmable read only memory (PROM).

15. A programmable logic device comprising:

a plurality of programmable logic blocks, each of said logic blocks comprising a plurality of input terminals and a plurality of output terminals;

a plurality of device terminals;

an output routing resource arrangement, said output routing resource arrangement comprising a plurality of programmable connections for connecting individual ones of said output terminals through input/output cells to individual ones of said device terminals, said programmable connections being located outside of said logic blocks;

wherein at least one of said device terminals is programmably connectable via said control routing resource arrangement to output terminals in two or more of said logic blocks; and wherein at least one of said logic blocks comprises an erasable programmable read only memory (EPROM).

16. A programmable logic device comprising;

a plurality of programmable logic blocks, each of said logic blocks comprising a plurality of input terminals and a plurality of output terminals;

a plurality of device terminals;

an output routing resource arrangement, said output routing resource arrangement comprising a plurality of programmable connections for connecting individual ones of said output terminals through input/output cells to individual ones of said device terminals, said programmable connections being located outside of said logic blocks;

wherein at least one of said device terminals is programmably connectable via said output routing resource arrangement to output terminals in two or more of said logic blocks; and wherein at least one of said logic blocks comprises an electrically erasable programmable read only memory (EEPROM).

17. A programmable logic device comprising:

a plurality of programmable logic blocks, each of said logic blocks comprising a plurality of input terminals and a plurality of output terminals;

a plurality of device terminals;

an output routing resource arrangement, said output routing resource arrangement comprising a plurality of programmable connections for connecting individual ones of said output terminals through input/output cells to individual ones of said device terminals, said programmable connections being located outside of said logic blocks;

wherein at least one of said device terminals is programmably connectable via said output routing resource arrangement to output terminals in two or more of said logic blocks; and wherein at least one of said logic blocks comprises a combination of multiplexers.

18. A programmable logic device comprising:

a plurality of logic blocks, each of said logic blocks comprising a plurality of input terminals and a plurality of output terminals;

a plurality of device terminals;

an output routing resource arrangement, said output routing resource arrangement comprising a plurality of programmable connections for connecting individual ones of said output terminals through input/output cells to individual ones of said device terminals, wherein one, and only one, of said programmable connections need be programmed in order to connect one of said output terminals to one of said device terminals.

19. The programmable logic device of claim 18 wherein at least one of said output terminals is programmably connectable via said output routing resource arrangement to two or more of said device terminals simultaneously.

* * * * *

UNITED STATES PATENT AND TRADEMARK OFFICE
CERTIFICATE OF CORRECTION

PATENT NO.    :  5,204,556
DATED         :  April 20, 1993
INVENTOR(S)   :  Kapil Shankar It is certified that error appears in the above-identified patent and that said Letters Patent is hereby corrected as shown below:

At col. 5, line 68, after "May 6, 1991", insert --now U.S. Patent No. 5,191,243 issued March 2, 1993--;

At col. 6, line 6, after "07/696,907", insert --now U.S. Patent No. 5,191,243 issued March 2, 1993--;

At col. 7, line 6, delete "07/696,543" and substitute --07/696,453--.

Signed and Sealed this

Twenty-sixth Day of September, 1995

*Attest:*

BRUCE LEHMAN

*Attesting Officer*     *Commissioner of Patents and Trademarks*